United States Patent
Ferchland et al.

(10) Patent No.: US 7,859,435 B2
(45) Date of Patent: Dec. 28, 2010

(54) METHOD FOR RATE INCREASE AND METHOD FOR RATE REDUCTION

(75) Inventors: Tilo Ferchland, Dresden (DE); Eric Sachse, Leipzig (DE); Michael Schmidt, Dresden (DE)

(73) Assignee: Atmel Automotive GmbH, Heilbronn (DE)

( * ) Notice: Subject to any disclaimer, the term of this patent is extended or adjusted under 35 U.S.C. 154(b) by 0 days.

(21) Appl. No.: 12/580,826

(22) Filed: Oct. 16, 2009

(65) Prior Publication Data

US 2010/0103000 A1    Apr. 29, 2010

Related U.S. Application Data

(60) Provisional application No. 61/117,391, filed on Nov. 24, 2008.

(30) Foreign Application Priority Data

Oct. 27, 2008   (DE) .................... 10 2008 053 295

(51) Int. Cl.
*H03M 7/00* (2006.01)
(52) U.S. Cl. .......................... 341/61; 708/290; 708/313
(58) Field of Classification Search .................. 341/61; 708/290, 313
See application file for complete search history.

(56) References Cited

U.S. PATENT DOCUMENTS

| | | | |
|---|---|---|---|
| 4,020,332 A * | 4/1977 | Crochiere et al. ............ 708/290 |
| 6,208,671 B1 * | 3/2001 | Paulos et al. ................. 370/545 |
| 6,411,225 B1 * | 6/2002 | Van Den Enden et al. ...... 341/61 |
| 6,778,106 B2 * | 8/2004 | Lenez et al. .................. 341/61 |
| 7,185,036 B1 | 2/2007 | Wang et al. |
| 7,236,110 B2 | 6/2007 | Antonesei |
| 7,302,459 B2 * | 11/2007 | Bossmeyer et al. .......... 708/313 |
| 7,498,957 B2 * | 3/2009 | De Buys ...................... 341/61 |

OTHER PUBLICATIONS

Fliege, N.: Multirate Signal Processing: "Theory and Applications", B.G. Teubner, Stuttgart, 1993, ISBN 3-519-06155-4 pp. 134-140.

* cited by examiner

*Primary Examiner*—Khai M Nguyen
(74) *Attorney, Agent, or Firm*—Muncy, Geissler, Olds & Lowe, PLLC

(57) ABSTRACT

A method for a rate increase and a method for a rate reduction of a sampling input sequence into a sampling output sequence is provided. The sampling input sequence is subjected to signal processing. Signal processing maps a spreading with a first factor and an interpolation and a decimation with a second factor to generate the sampling output sequence with use of a counter. The counter and the signal processing are clocked with the higher rate, in each case, of the sampling input sequence or the sampling output sequence, respectively.

18 Claims, 4 Drawing Sheets

| $k^0$ | $r(k^0)$ | $g(k^0)$ | Ausgabe |
|---|---|---|---|
| 0 | 0 | 1 | $y(n+0) = \sum_{s=0}^{L} B^0(s)x(k-s)$ |
| 1 | 2 | 1 | $y(n+1) = \sum_{s=0}^{L} B^2(s)x(k+1-s)$ |
| 2 | 2 | 0 | x |
| 3 | 1 | 1 | $y(n+2) = \sum_{s=0}^{L} B^1(s)x(k+3-s)$ |
| 4 | 1 | 0 | x |
| 0 | 0 | 1 | $y(n+3) = \sum_{s=0}^{L} B^0(s)x(k+5-s)$ |
| ... | ... | ... | ... |

| $n^0$ | $r(n^0)$ | $g(n^0)$ | Ausgabe |
|---|---|---|---|
| 0 | 0 | 1 | $y(n+0) = \sum_{s=0}^{L} B^0(s)x(k-s)$ |
| 1 | 3 | 0 | $y(n+1) = \sum_{s=0}^{L} B^3(s)x(k-s)$ |
| 2 | 1 | 1 | $y(n+2) = \sum_{s=0}^{L} B^1(s)x(k+1-s)$ |
| 3 | 4 | 0 | $y(n+3) = \sum_{s=0}^{L} B^4(s)x(k+1-s)$ |
| 4 | 2 | 1 | $y(n+4) = \sum_{s=0}^{L} B^2(s)x(k+2-s)$ |
| 0 | 0 | 1 | $y(n+5) = \sum_{s=0}^{L} B^0(s)x(k+3-s)$ |
| ... | ... | ... | ... |

METHOD FOR RATE INCREASE AND METHOD FOR RATE REDUCTION

This nonprovisional application claims priority to German Patent Application No. 10 2008 053 295.9, which was filed in Germany on Oct. 27, 2008, and to U.S. Provisional Application No. 61/117,391, which was filed on Nov. 24, 2008, and which are both herein incorporated by reference.

BACKGROUND OF THE INVENTION

1. Field of the Invention

The invention relates to a method for a sampling rate increase and to a method for a sampling rate reduction.

2. Description of the Background Art

Signal processing according to telecommunications engineering is known. Primarily in communications technology, time-discrete processing requires sampling of telecommunication signals.

In telecommunications engineering, sampling rate conversion is often necessary. Here, first sample values at a first rate are converted into second sample values at a second rate.

Generally, the first sample values are spread by a first factor and then decimated by a second factor. In the signal resulting in the interim, interpolation occurs with a clock, inter alia, dependent on the spreading factor. It is a disadvantage in this case that this clock often cannot be made available primarily at high spreading factor values.

A method for reducing the sampling rate is known, for example, from U.S. Pat. No. 7,236,110. The method disclosed therein, however, has the further disadvantage that the FIR filter (finite impulse response) used for realizing the method permits no degrees of freedom in the frequency response.

SUMMARY OF THE INVENTION

It is therefore an object of the present invention to provide a method that improves the aforementioned procedure in signal processing.

In the method of the invention for increasing the rate of a sampling input sequence into a sampling output sequence, the sampling input sequence can be subjected to signal processing. The sampling input sequence has a first rate and the sampling output sequence has a second rate. The distances of the sampling output sequence and the sampling input sequence in this case are preferably not equidistant.

The signal processing maps a spreading with a first factor and an interpolation and decimation with a second factor to generate the sampling output sequence with use of a counter. The signal processing and the counter in this case are clocked at the second rate, so that a sampling of the sampling input sequence is controlled by the counter in such a way that at an output of the counter first values are formed, which determine the sampling of the sampling input sequence in such a way that the sampling output sequence is generated at a second rate, whose value is higher than the value of the first rate. The signal processing to generate the sampling output sequence is also controlled by the counter.

In the method of the invention for rate reduction of a sampling input sequence into a sampling output sequence, the sampling input sequence is subjected to signal processing. The sampling input sequence has a first rate and the sampling output sequence has a second rate. The distances of the sampling output sequence and the sampling input sequence in this case are preferably not equidistant.

The signal processing for this purpose maps a spreading with a first factor and an interpolation and decimation with a second factor to generate the sampling output sequence, whereby the mapping occurs with use of a counter. The signal processing and the counter are clocked at the first rate, so that the sampling output sequence is controlled by the counter in such a way that first values are formed at an output of the counter. The first values determine the sampling of an interpolated sequence formed from the sampling input sequence in such a way that the sampling output sequence is generated at a second rate, whose value is lower than the value of the first rate. The signal processing to form the interpolated sequence is also controlled by the counter.

An advantage of the method of the invention is the avoidance of a very high clock of the interpolation by implementing the control by the counter. Because equidistant intervals of the input or output sequence are not necessary, nevertheless, a high spreading factor can be achieved.

The rate increase according to the invention can be used especially advantageously transmitter-side, because it has the advantage there that transmitter-side the sample values must be applied at a digital-to-analog converter (DAC) generally also equidistant in time. Further, the rate increase according to the invention, moreover, has the advantage that during the signal processing no rate is necessary that is greater than the sampling output rate. In contrast, the rate reduction according to the invention receive-side is especially advantageous so that during the signal processing no rate is required that is greater than the sampling input rate.

According to an embodiment, in the case of the rate increase or rate reduction, the signal processing can be controlled by the counter in that a coefficient set (polyphase indexes) of the signal processing is determined by means of an output value of the counter. Preferably, for this purpose, by means of the output value of the counter, signal processing coefficients are read out of a memory, particularly a value table (LUT—lookup table). Alternatively, the coefficient set (polyphase indexes) of signal processing is calculated as a function of the output value of the counter.

The rate reduction can occur in such a way that to generate the second rate a counter forms the second values or the output values from a first set $\{0, 1, \ldots, N-1\}$, particularly in a cyclic manner. In this case, a number N of the first set is defined in such a way that the product of the first factor and the number N in a modulo division by the second factor always yields the value "0." The rate increase occurs in such a way that to generate the second rate the counter forms the first values from a first set $\{0, 1, \ldots, N-1\}$, particularly in a cyclic manner. In this case, the number N is defined in such a way that the product of the second factor and the number N in a modulo division by the first factor always yields the value "0." Thus, in each case a simple implementation of the sequence formation is realized, which enables further in addition the use of the counter for the addressing of a finite number of precalculated values of polyphase indexes and the clock control of the signal processing.

In an embodiment, the polyphase index of a coefficient set of the interpolation can be formed as a function of the first values. As a result, a simple adapted control of the interpolation to achieve the effect of the invention is realized.

For the case that values derived as a function of the first values are formed for clock control, there is a simple adapted control of the clocking to achieve the effect of the invention.

To have available the sampling input sequence, in another embodiment in the case of rate reduction, a number of L values of the sampling input sequence is stored in a shift register, so that thereby a simple (software or hardware)

implementation of the FIR filtering is supported. Preferably, in the case of the rate increase as a function of the first value of the clock control, the specific value of the sampling input sequence is stored in an L+1-valued shift register, so that a simple implementation of the FIR filtering is supported.

For signal processing, the interpolation occurs preferably with use of an FIR operation. In the case of the reduction, the FIR operation is carried out as a function of the coefficient set, shift register values, and the sampling input value. In the case of the increase, the FIR operation occurs as a function of the coefficient set and shift register values, so that supportive simple implementations are possible for the specific rate conversion variants.

In another refinement of the method of the invention, a taking up of an output value of the FIR operation occurs as a function of a derived value of the clock control, particularly in an output register. An optimal timing is achievable as a result.

The rate conversion occurs in such a way that except for a time shift the values at the output of the output register form a sequence, which is converted from the sampling input sequence.

An arrangement for the rate increase, particularly during a sampling according to any of the aforementioned procedures, is designed in such a way that the arrangement converts a sampling input sequence into a sampling output sequence. In so doing, the sampling input sequence has a first rate and the sampling output sequence a second rate.

To this end, the sampling input sequence is supplied to a signal processing device. The signal processing device in this case is designed in such a way that it maps a spreading with a first factor and an interpolation and a decimation of a sequence resulting from the interpolation with a second factor to generate a sampling output sequence. To this end, the signal processing device has a sampling device, which is connected to the counter in such a way that at one output of the counter first values are formed, which are supplied to the sampling device. The first values control the sampling device in such a way that the sampling output sequence is generated at a second rate, whose value is higher than the value of the first rate. The second rate is supplied to the signal processing device and the counter as a clock.

An arrangement for rate reduction, particularly during sampling according to any of the aforementioned procedures, is designed in such a way that it converts a sampling input sequence, having a first rate, into a sampling output sequence, having a second rate. To this end, the sampling input sequence is supplied to a signal processing device. The signal processing device in this case is designed in such a way that it maps a spreading with a first factor and an interpolation and a decimation of a sequence resulting from the interpolation with a second factor to generate a sampling output sequence. To this end, the signal processing device has a sampling device, which is connected to the counter in such a way that at one output of the counter first values are formed, which are supplied to the sampling device. The first values control the sampling device in such a way that the sampling output sequence is generated at a second rate, whose value is lower than the value of the first rate. The first rate is supplied to the signal processing device and the counter as a clock.

An advantage of the arrangement is the avoidance of high intermediate rates which occurs according to the invention with use of the fact that input or output sequences need not be present necessarily equidistant in time in each case of use.

If the counter is designed in such a way that it forms the first values from a first set $\{0, 1, \ldots, N-1\}$, particularly in a cyclic manner, a simple implementation is thus provided by this refinement of the arrangement of the invention.

The counter can be designed in such a way that a number N of the first set is defined in such a way that the product of the first factor and the number N in a modulo division by the second factor always yields the value "0." In a refinement, the first counter is designed in such a way that a number N is defined in such a way that the product of the second factor and the number N in a modulo division by the first factor always yields the value "0."

The arrangement of the invention is refined especially advantageously in that an output signal of the first counter is entered in a first value table (LUT, lookup table), so that it outputs the value determining the clock control. The output signal of the first counter is entered in a second value table in such a way that it outputs the polyphase index of an interpolation device. The value tables make an essential contribution to the realization of the invention with a simultaneous simple possibility for implementation.

Furthermore, the interpolation device is designed as an FIR adder in such a way that it supplies the sampling output signal as the output signal and therefore can be used especially advantageously during the rate increase.

In an alternative embodiment, the FIR adder is connected to an output register in such a way that the output signal of the output register supplies the sampling output signal. This can be used especially advantageously during rate reduction.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Other advantages and details of the invention are explained in greater detail based on the principle, explained in FIG. 1, of the FIR-based rate conversion with use of two exemplary embodiments of the method of the invention, as depicted in FIGS. 2 through 7, and the specific exemplary circuitry implementations of the arrangement of the invention.

Figure 1A:
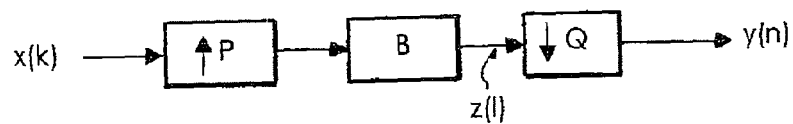
FIG. 1a shows a principle of a rate conversion based on an FIR filter.

The main approach during signal processing is illustrated in FIG. 1a.

Sampling rate conversion plays an important role in time-discrete signal processing. In this case, sampling values of a first rate $R_k$ are converted to sampling values of a second rate $R_n$.

The principles for this are known and are often based on linear interpolation. The inventive considerations proceed from the case that $$\frac{R_k}{R_n} = \frac{P}{Q}$$

applies, where P designates a spreading factor and Q a decimation factor. Both factors are integers and relatively prime without restriction of generality. The quotient P/Q in this case is a non-integer rational number. Further, the interpolation is limited to a "finite impulse response" (FIR) filter B with a finite impulse response of the length (L+1)P.

In a first step, an input sequence x(k) of the first rate $R_k$ is spread by insertion of a number of P−1 zeros in each case between these sampling values.

This sequence is filtered in another step. The filtering in this case occurs with an interpolation filter with impulse response B, to reach in an intermediate step initially in an interpolated sequence z(l) of a third rate $R_l$, which arises from the product of the spreading factor P and the first rate $R_k$, therefore $R_l = PR_k$.

The interpolated sequence z(l) is finally decimated with decimation factor Q, so that an output sequence y(n) of the second rate $R_n$ is obtained.

In a specific technical implementation of this principle, two properties are used:
1. The zero values within the spread sequence make no contribution in the multiplication by the filter coefficients.
2. Rejected values during decimation need not be calculated.

Figure 1B:
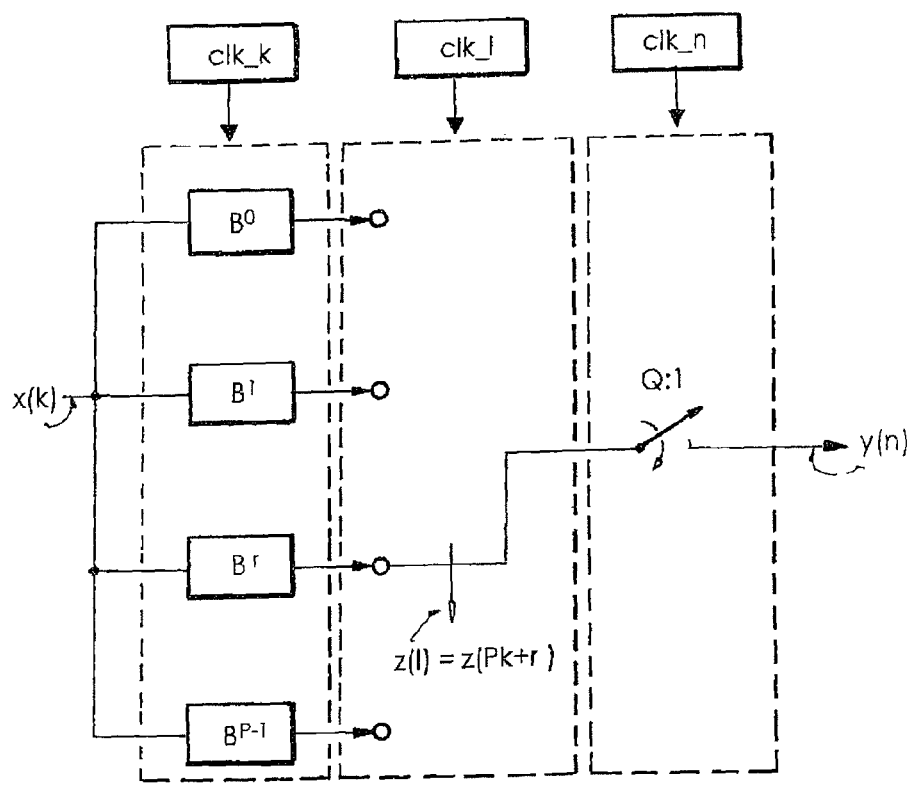
FIG. 1b shows filtering, based on the principle, with polyphases.

Filtering used in the main procedure and based on polyphases is shown in FIG. 1b.

It is evident here that instead of a convolution of the spread input sequence x(k) with the interpolation filter B, the input sequence x(k) with the polyphase $$B^r = \{B(kP+r)\}_{k=0,\ldots,}$$

is filtered at an interpolation clock clk_l of the rate $R_K$.

The switching of the polyphase occurs in the interpolation clock clk_l, whereby based on the fact that B has a length (L+1)P, each polyphase has L+1 filter coefficients. The r-th polyphase is obtained by sampling of B according to the above equation. In this case, the index l is obtained from the first rate $R_k$, the spreading factor P, and the polyphase index r as l=kP+r.

The signal processing occurs in the shown use of polyphase filtering with a first clock clk_k, which has the first rate $R_k$.

In addition, in the variant shown, a calculation must be performed only when $$(kP+r) \bmod Q = 0$$

applies.

According to an inventive train of thought, it has been recognized, however, that it is problematic that for the switching of the polyphase, clocking with a value of the interpolation clock clk_l seems to be necessary, which is based on the high third rate $R_l = PRk$. An interpolation clock clk_l with such a high rate is not available in certain application cases. This applies primarily in an application with a large spreading factor P.

Proceeding from the explained signal processing, avoidance of an interpolation clock clk_l with the high rate $R_l = PR_k$ is to be achieved.

In this case, according to the invention, use is made of the fact that the sampling values of the input or output sequence need not necessarily always be at equidistant time intervals.

Figure 2:
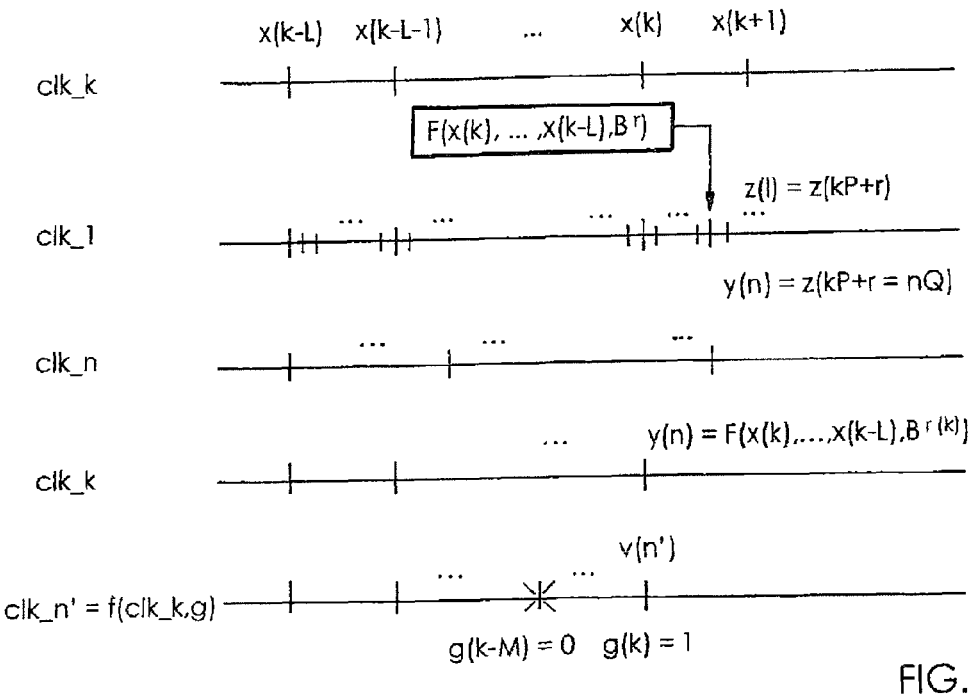
FIG. 2 shows a rate reduction as a first exemplary embodiment.

Based on this, the signal course of the aforementioned signals is shown schematically in FIG. 2. For this purpose, a variant is considered in which the value of the spreading factor P is smaller than the value of the decimation factor Q—therefore P<Q applies. The rate conversion of the invention therefore includes reducing the output rate relative to the input rate.

It is evident in the illustration that the values of the input sequence x(k) with respect to their clocking with a first clock clk_k are supplied to processing.

The value of the interpolation clock clk_l, said value being higher by the value of the spreading factor P, provides at a value of the interpolation clock clk_l of the third rate I=kP+r values of the intermediate sequence z(l) at the output of the polyphase filter $B^r$. For r=0, . . . , P−1, $$z(l = kP + r) = F(x(k), \ldots, x(k-L), B^r) = \sum_{s=0}^{L} x(k-s)B^r(s)$$

applies.

If Pk+r=nQ now applies for an integer n, then the result is the desired sampling value as the output signal y(n) with an equidistant second clocking clk_n.

Because the output signal y(n) depends only on the values of the input signal x(k), . . . , x(k−L), however, even for a clock with the value kP, the output quantity can be calculated according to the formula $$y(n) = F(x(k), \ldots, x(k-L), B^r) = \sum_{s=0}^{L} x(k-s)B^{r(k)}(s) = v(n'(k)),$$

whereby the index of the polyphase r=r(k) must be known for this.

The output sequence in this case results from a non-equidistant sampling. This is indicated in the equations by the index n'.

Because the first rate $R_k$ of the first clock clk_k (input clock) has a higher value than the second rate $R_n$ of the second clock clk_n (output clock), there must be cases in which the output is suppressed. This is indicated by g(k)=0 as is marked in FIG. 2 as well.

If the values n'(k), r(k), and g(k) are known for a certain k and consequently also the output value v(n'(k)), then recursively n'(k+1), r(k+1), and g(k+1) and consequently also v(n'(k+1)) can be calculated according to the invention.

Two cases are differentiated for each recursion step k−>k+1:

1.) (k+2)P>(n'(k)+1)Q applies. Then, n'(k+1)=n'(k)+1, r(k+1)=n'(k+1)Q mod P is set. With the setting of g(k+1)=1, it is indicated that $$F(x(k+1), \ldots, x(k-L-1), B^{r(k+1)})$$

is to be taken up in v(n'(k+1)).

2.) $(k+2)P<=(n'(k)+1)Q$ applies. Then $n'(k+1)=n'(k)$, $r(k+1)=r(k)$ is set and with the setting of $g(k+1)=0$ it is indicated that $$F(x(k+1), \ldots, x(k-L-1), B^{r(k+1)})$$

is not to be taken up in $v(n'(k+1))$.

The sequences $v(n'(k))$ and $y(n)$ are identical, whereby the values $v(n'(k))$ generally are not at equidistant time intervals. The latter is not a problem in telecommunication systems at least on the receiver side, because certain latencies are tolerated by the transformation of the physical into the logical level.

Without restriction of generality, $n'(0)=0$, $r(0)=0$, and $g(0)=1$ can then be defined. The sequences $r(k)$ and $g(k)$ are periodic for a finite N. If at a time $l=kP+r$ $$(l \bmod Q)=(l \bmod P)=r$$

applies, then for the number N with NP mod Q=0 at time $l'=(k+N)P+r$ the following also applies:

$$(l' \bmod Q)=(l' \bmod P)=r.$$

For this reason, only a finite number of the values $r(k)$ and $g(k)$ for $k=0, \ldots, N-1$ need to be precalculated.

Figure 3:
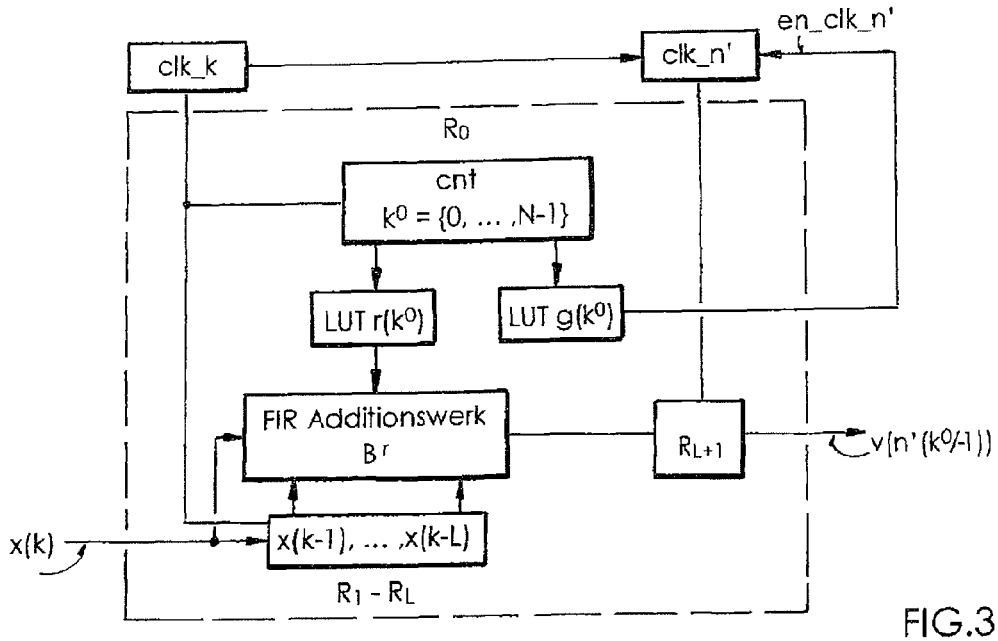
FIG. 3 shows a diagram of the rate reduction according to the invention.

FIG. 3 illustrates schematically an exemplary embodiment of the circuitry realization of the invention as taught by the invention, whereby the variant to achieve a rate reduction without interpolation clock clk_l is shown.

It can be seen that according to the invention the input clock clk_k is available due to a counter realized by a first register $R_0$. This counter according to the invention outputs cyclically the values $k^0=0, \ldots, N-1$. The value $k^0$ in this case forms the address with which the values for $r(k^0)$ are stored in a first value table LUT $r(k^0)$ and for $g(k^0)$ in a second value table LUT $g(k^0)$ for $k^0=0, \ldots, N-1$, whereby the value tables according to the exemplary embodiment are realized as so-called lookup tables.

The current value $r=r(k^0)$ therefore also forms the address for the coefficient set $B^r$. The L last input values $x(k-1), \ldots, x(k-L)$ are stored in a second shift register $R_1, \ldots, R_L$, so that together with the current value of the input value $x(k)$, the output value $y(n)$ can be calculated. This value, however, is only taken up in a third register $R_{L+1}$ when $g(k^0)=1$. This is achieved according to the invention in that in the exemplary embodiment a clocking clk_n' at $g(k^0)=0$ is suppressed.

Figures 4, 5:
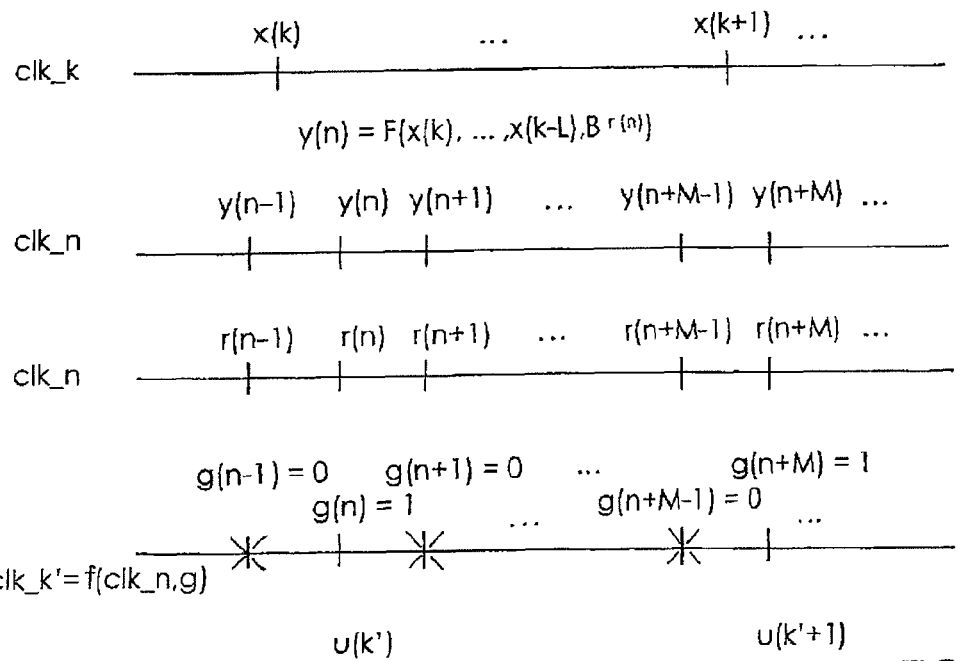
FIG. 4 shows a table for individual values for the first exemplary embodiment of a rate reduction.
FIG. 5 shows a rate increase as a second exemplary embodiment.

When the circuit described in FIG. 3 is used, the output values $y(n)$ shown in FIG. 4 result, when during rate reduction the value 3 is used for the spreading factor P and the value 5 for the decimation factor Q, whereby N=Q=5 can be set.

FIG. 5 shows a signal course of the aforementioned signals schematically, in which another variant differing from the variant described heretofore is considered. In contrast to the previously described variant, the value of the spreading factor P is greater than the value of decimation factor Q, and therefore P>Q applies. The rate conversion includes increasing the output rate relative to the input rate.

The principle of the invention can also be used for Q<P, when according to the second exemplary embodiment the non-equidistant processing occurs on the input side. This is appropriate in telecommunication systems at least on the transmitter side, because here instead of a rate reduction generally a rate increase is sensible and the sampling values must be applied to a digital-to-analog converter (DAC) employed here generally also equidistant in time.

FIG. 5 clarifies in this case that the values $y(n)$ run through the second clock clk_n.

$$y(n) = F(x(k), \ldots, x(k-L), B^{r(n)}) = \sum_{s=0}^{L} x(k-s)B^{r(n)}(s)$$

applies for a certain polyphase index $$r(n) \in [0, 1, \ldots, P-1].$$

Because the rate relative to the index n is higher than the first rate $R_k$, however, there must be cases in which the input values are suppressed; i.e., a calculation must occur on the basis of $$y(n) = F(u(k'(n)), \ldots, u(k'(n)-L), B^{r(n)}) = \sum_{s=0}^{L} u(k'(n)-s)B^{r(n)}(s)$$

for certain $u(k'(n)), \ldots, u(k'(n)-L)$. The output sequence here therefore results for this case as well by means of non-equidistant sampling, which is indicated for the present case by the index k' in the equation. If the values $u(k'(n)), \ldots, u(k'(n-L))$, as well as $k'(n)$, $g(n)$, and $r(n)$ are known for the given n, during the recursion n->n+1 two cases can be differentiated:

1.) $(k'(n)+1)P<=(n+1)Q$ applies. Then $k'(n+1)=k'(n)+1$ is set and $x(k+1)$ is taken up in $u(k'(n+1))$; i.e., $g(n+1)=1$ and $r(n+1)=(n+1)Q \bmod P$ are set.

2.) $(k'(n)+1)P>(n+1)Q$ applies. Then $k'(n+1)=k'(n)$ is set and $x(k+1)$ is not taken up in $u(k'(n+1))$; i.e., $g(n+1)=0$ and also $r(n+1)=(n+1)Q \bmod P$ are set.

The sequences $x(k)$ and $u(k'(n))$ are identical, whereby the values $u(k'(n))$ generally are not at equidistant time intervals. $g(n=0)=1$ and without limitation of generality $k'(0)=0$ and $r(0)=0$ can be defined, as a result of which $g(n)$ and $r(n)$ can be precalculated recursively for $n=1, \ldots, N-1$. The sequences $g(n)$ and $r(n)$ are periodic for N with NQ mod P=0. In other words, there is no remainder during division of N*Q by P.

Figures 6, 7:
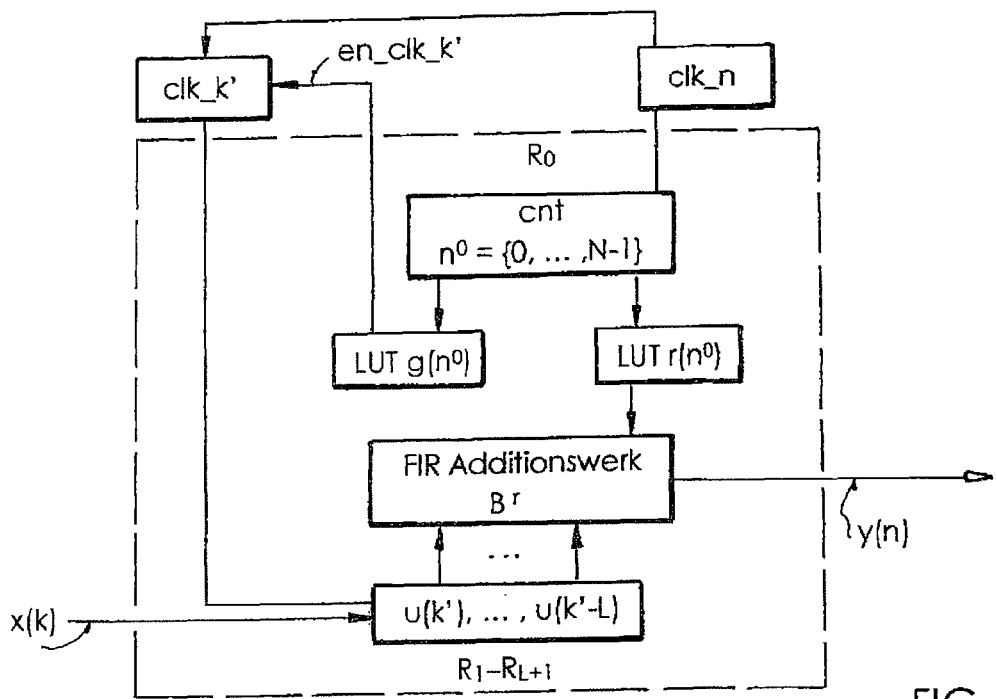
FIG. 6 shows a diagram of the rate increase.
FIG. 7 shows an example of a rate increase for P=5 and Q=3.

FIG. 6 shows the circuitry realization of this exemplary embodiment. The counter, which is based on a first register $R_0$, is again clocked with the second clock clk_n, and outputs cyclically the values $n^0=0, \ldots, N-1$. The value $n^0$ in this case forms the address in regard to $g(n^0)$ and $r(n^0)$, whose values for $n^0=0, \ldots, N-1$ are stored in each case in a first table LUT $g(n^0)$. The current value $r(n^0)$ forms the address for the coefficient set $B^r$. The L+1 input values are stored in a second shift register $R_1, \ldots, R_{L+1}$, so that the output value of the filter can be calculated for each clock relative to the second clock clk_n. The current input value $x(k)$ is then taken up only in the second shift register $R_1, \ldots, R_{L+1}$, when $g(n^0)=1$ applies. For example, this is achieved by suppressing a clocking clk_k' when $g(n^0)=0$.

When the circuit described in FIG. 6 is used, the output values $y(n)$ shown in FIG. 7 result, when during the rate increase the value 5 is used for the spreading factor P and the value 3 for decimation factor Q, whereby N=P=5 can be set.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for increasing a rate of a sampling input sequence into a sampling output sequence, the method comprising:
   providing the sampling input sequence with a first rate and the sampling output sequence with a second rate, a value of the second rate being higher than a value of the first rate;
   subjecting the sampling input sequence to signal processing;
   mapping a spreading with a first factor and an interpolation and a decimation with a second factor to generate the sampling output sequence on the signal processing with use of a counter;
   clocking the signal processing and the counter at the second rate;
   controlling a sampling of the sampling input sequence by the counter such that at an output of the counter first values are provided that determine the sampling of the sampling input sequence; and
   controlling the signal processing by the counter to generate the sampling output sequence such that the sampling output sequence is generated at the second rate.

2. The method according to claim 1, wherein the sampling is controlled such that to generate the second rate the first values are formed by the counter from a first set, wherein a number N of the first set is defined such that the product of the second factor and the number in a modulo division by the first factor always produces as a result the value "0."

3. The method according to claim 1, wherein a polyphase index of a coefficient set of the interpolation is formed as a function of the first value.

4. The method according to claim 1, wherein a polyphase index of a coefficient set of the interpolation is formed as a function of the second value.

5. The method according to claim 1, wherein a derived value for a clock control is formed as a function of the first value.

6. The method according to claim 1, wherein a current value of the sampling input sequence is stored in a shift register as a function of the clock control.

7. The method according to claim 1, wherein an interpolation uses an FIR operation, wherein the FIR operation is carried out as a function of the coefficient set and shift register values.

8. The method according to claim 7, wherein a taking up of an output value of the FIR operation occurs as a function of the derived values ($g(k^0)$, $g(n^0)$) of the clock control, particularly in an output register.

9. The method according to claim 1, wherein a polyphase index of a coefficient set of the interpolation is formed as a function of the first value.

10. The method according to claim 1, wherein a derived value for a clock control is formed as a function of the first value.

11. A method for reducing a rate of a sampling input sequence into a sampling output sequence, the method comprising:
    providing the sampling input sequence with a first rate and the sampling output sequence with a second rate, a value of the second rate being lower than a value of the first rate;
    subjecting the sampling input sequence to signal processing;
    mapping a spreading with a first factor and an interpolation and a decimation with a second factor to generate the sampling output sequence on the signal processing with use of a counter;
    clocking the signal processing and the counter at the first rate;
    controlling a sampling output sequence by the counter such that at an output of the counter second values are provided that set the sampling of an interpolated sequence formed from the sampling input sequence to generate the sampling output sequence at the second rate; and
    controlling the signal processing by the counter such that the signal processing forms the interpolated sequence.

12. The method according to claim 11, wherein the sampling is controlled in such a way that to generate the second rate the second values are formed by the counter from a second, wherein a number N of the second set is determined in such a way that the product of the first factor and the number N in a modulo division by the second factor always produces as a result the value "0."

13. The method according to claim 11, wherein a derived value for a clock control is formed as a function of the second value.

14. The method according to claim 11, wherein values of the sampling input sequence are stored in a shift register.

15. The method according to claim 11, wherein the interpolation occurs uses an FIR operation, whereby the FIR operation is carried out as a function of the coefficient set, shift register values, and the specific sampling input value.

16. The method according to claim 15, wherein a taking up of an output value of the FIR operation occurs as a function of the derived values ($g(k^0)$, $g(n^0)$) of the clock control, particularly in an output register.

17. The method according to claim 2, wherein a polyphase index of a coefficient set of the interpolation is formed as a function of the second value.

18. The method according to claim 11, wherein a derived value for a clock control is formed as a function of the second value.

* * * * *